United States Patent
Deutsch

(10) Patent No.: US 9,063,702 B2
(45) Date of Patent: Jun. 23, 2015

(54) AIR SUPPORTED FRAME FOR AN LED DISPLAY

(71) Applicant: Deutsch, Inc., Rockville, MD (US)

(72) Inventor: Robert Deutsch, Rockville, MD (US)

(73) Assignee: Deutsch, Inc., Rockville, MD (US)

( * ) Notice: Subject to any disclaimer, the term of this patent is extended or adjusted under 35 U.S.C. 154(b) by 237 days.

(21) Appl. No.: 13/912,801

(22) Filed: Jun. 7, 2013

(65) Prior Publication Data

US 2014/0362511 A1 Dec. 11, 2014

(51) Int. Cl.
G06F 1/16 (2006.01)
H05K 7/20 (2006.01)
F16M 11/04 (2006.01)
F16M 11/22 (2006.01)

(52) U.S. Cl.
CPC ............ *G06F 1/1656* (2013.01); *G06F 1/1603* (2013.01); *G06F 1/1637* (2013.01); *H05K 7/20972* (2013.01); *F16M 11/041* (2013.01); *F16M 11/22* (2013.01); *F16M 2200/08* (2013.01)

(58) Field of Classification Search
CPC . E04H 15/20; F05B 2240/31; F05B 2240/98; F05B 2270/325; F16K 1/302; F16K 7/10; G03B 17/08; G03B 21/58; G03B 21/585
USPC ....... 248/693; 359/443, 449; 40/610; 353/79; 348/370; 361/679.21, 679.49, 679.5, 361/690
See application file for complete search history.

(56) References Cited

U.S. PATENT DOCUMENTS

| | | | |
|---|---|---|---|
| 4,323,301 A * | 4/1982 | Spector | 359/443 |
| 6,008,938 A * | 12/1999 | Suehle et al. | 359/443 |
| 6,240,666 B1 * | 6/2001 | Apel et al. | 40/610 |
| 7,231,739 B2 * | 6/2007 | Scherba | 52/2.18 |
| 7,961,388 B1 * | 6/2011 | Deutsch et al. | 359/443 |
| 8,192,245 B2 | 6/2012 | Deutsch | |
| 8,201,203 B2 * | 6/2012 | Vitito | 725/75 |
| 8,243,366 B1 * | 8/2012 | Deutsch | 359/449 |
| 8,376,581 B2 | 2/2013 | Auld | |
| 2008/0231815 A1 * | 9/2008 | Ganzevoort | 353/79 |
| 2009/0107020 A1 * | 4/2009 | Aires | 40/610 |
| 2010/0007949 A1 * | 1/2010 | Clawson et al. | 359/443 |
| 2011/0297247 A1 * | 12/2011 | Deutsch et al. | 137/233 |
| 2011/0304908 A1 * | 12/2011 | Giammarinaro, Jr. | 359/450 |
| 2012/0170271 A1 | 7/2012 | Bertel | |
| 2013/0308250 A1 * | 11/2013 | Chiu et al. | 361/679.01 |

* cited by examiner

*Primary Examiner* — Hung S. Bui
*Assistant Examiner* — Michael Matey

(57) ABSTRACT

An air supported frame is provided for supporting a large LED display wherein the frame includes upper, lower and side segments and has a front portion and a rear portion and the LED display is positioned when in use within the frame substantially midway between the front portion and rear portion. Further, an additional support structure may be attached to the upper and lower segments of the air supported frame wherein the additional support structure bends, curves, or angles away from the plane of the display so as to provide support to the upper segment without interfering with the display. In addition, the air supported frame may include vent seals that allow greater air pressure to be held within the air supported frame and a covering to block light along with a ventilation system.

2 Claims, 3 Drawing Sheets

AIR SUPPORTED FRAME FOR AN LED DISPLAY

CROSS-REFERENCE TO RELATED APPLICATIONS

None.

STATEMENT REGARDING FEDERALLY SPONSORED RESEARCH OR DEVELOPMENT

Not applicable.

FIELD OF THE INVENTION

This invention relates to large, portable display systems.

BACKGROUND OF THE INVENTION

Large LED displays for use in outdoor environments are known in the art. Such displays are typically mounted on aluminum or steel trusses or supported by buildings or other permanent structures. However, there is a need for portable, lightweight structures that can be relatively simply and quickly erected and dismantled and that are capable of supporting large LED displays.

SUMMARY OF THE INVENTION

An object of the present invention is to provide an air supported framework for mounting a large LED display wherein the framework includes upper, lower and side segments and has a front portion and a rear portion and the LED display is positioned when in use within the framework substantially midway between the front portion and rear portion.

It is a further object of the invention to provide an additional support structure that is attached to the upper and lower segments of the air supported framework wherein the additional support structure bends, curves, or angles away from the plane of the display so as to provide support to the upper segment without interfering with the display.

It is a further object of the invention to include vent seals that allow greater air pressure to be held within the segments of the framework.

It is a further object of the invention to include a back covering that blocks light from striking the rear of the LED screen wherein ventilation is provided to prevent overheating of the LED screen while the covering is in place.

BRIEF DESCRIPTION OF THE DRAWINGS

FIG. 1b is a cutaway view of the embodiment of FIG. 1a.

DETAILED DESCRIPTION OF PREFERRED EMBODIMENTS

Figure 1A:
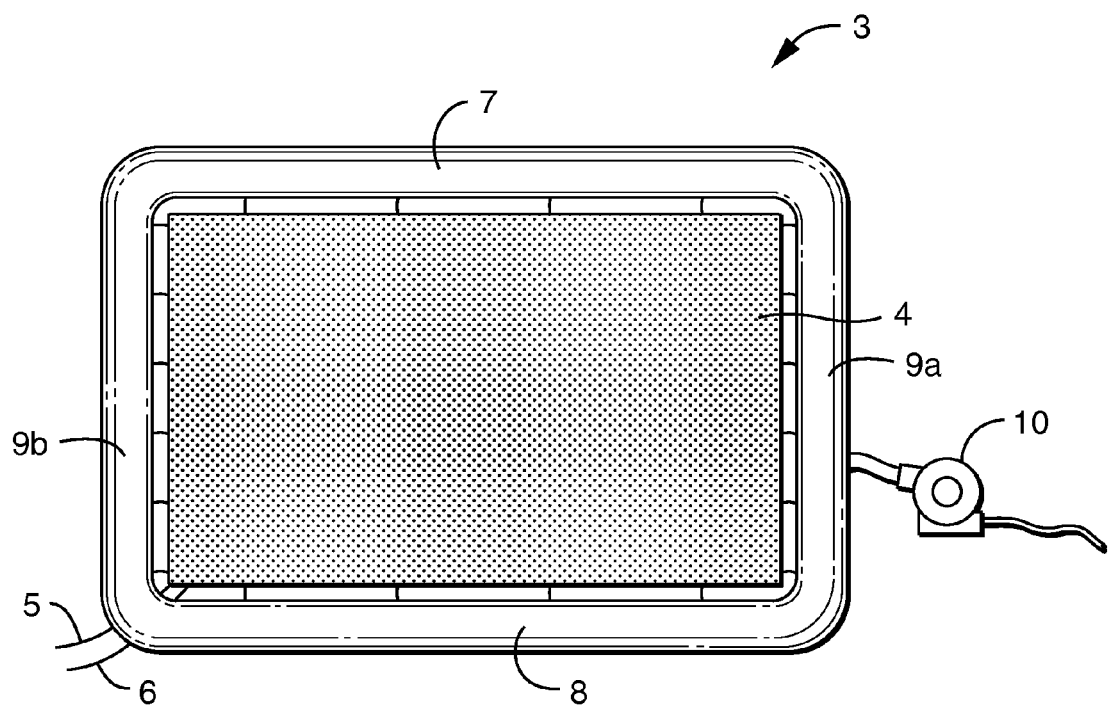
FIG. 1a depicts an embodiment of the present invention.

FIG. 1a depicts an embodiment of the current invention in which an air supported frame 3 is used to support an LED display 4. Power supply cables 5 and video signal cables 6 connect to the LED display 4 to provide power and display information respectively. The air supported frame 3 can be erected on a temporary basis, including in outdoor environments. The air supported frame 3 can include a top portion 7, a bottom portion 8, and side portions (9a, 9b). A blower 10 or other suitable mechanism is used to inflate the frame 3 and maintain sufficient pressure within. A series of stabilizing guy tethers (not shown) can be attached to the frame 3 in order to assist in holding the frame 3 in place and maintain the stability of the frame. The LED display 4 can be attached to the frame 3 by any suitable means such as hook and eye, for example. Once the frame 3 is fully inflated and the LED display 4 is attached and connected, images can be displayed. To improve portability of the whole system, LED display 4 is preferably flexible so that it can be rolled up or folded for easier transport and storage.

Figure 1B:
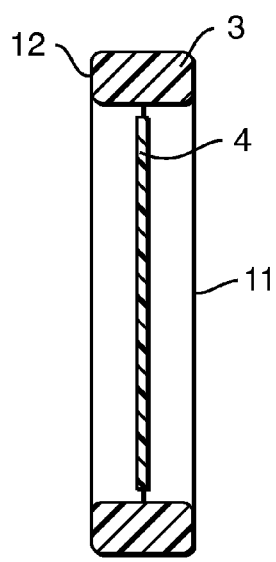

Preferably, as shown in FIG. 1b, LED display 4 is suspended midway between a front side 11 and a rear side 12 of frame 3 in order to prevent the weight of the display from destabilizing the frame.

Figure 2:
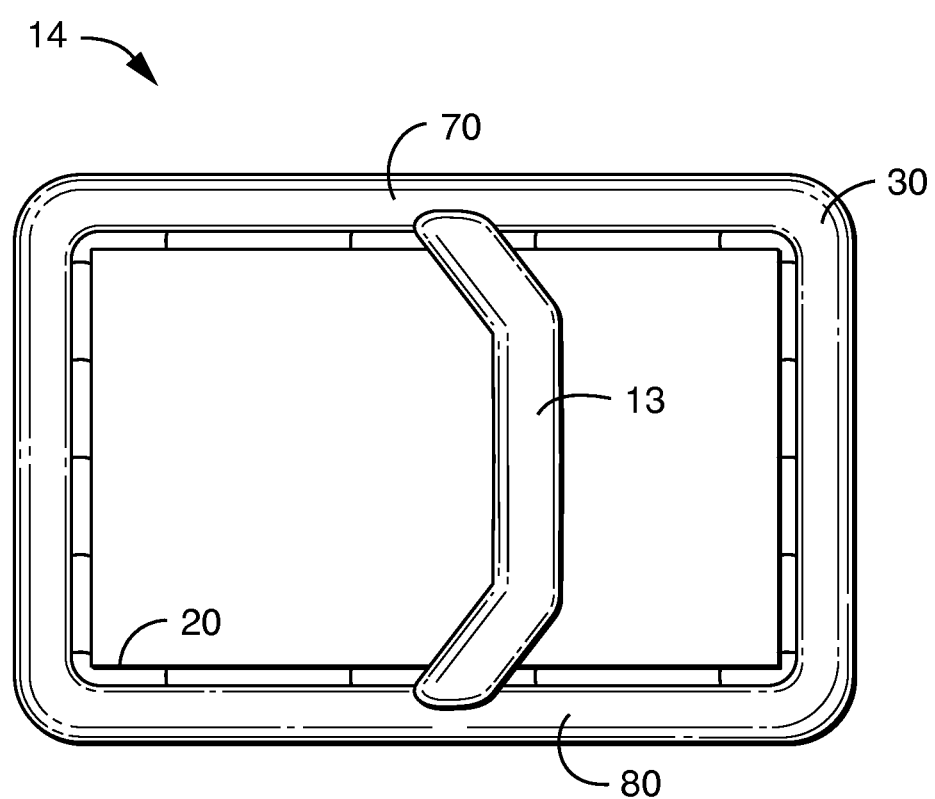
FIG. 2 is a perspective view of an embodiment of the present invention including an additional support.

Further support for an air supported frame may be required due to the extra weight associated with LED displays in order to prevent the top portion of the frame from bending or dipping too much. This may be accomplished by including additional support for the frame such as the type described in U.S. Pat. No. 7,961,388 to Deutsch et al, which is incorporated herein by reference. FIG. 2 shows a support structure 13 attached by heat welding, sewing, hook and loop fastener or other suitable means, to top portion 70 on one end and at the other end to bottom portion 80 of frame 30 of air supported device 14. The attachment mechanism can be reversible or be made more permanent. Support structure 13 can be made of plastic vinyl or other suitable materials. Support structure 13 is shaped such that it bends, curves, arches, or angles so that support structure 13 generally avoids the plane formed by the frame 30 in which LED display 20 resides when in use. For the embodiment shown in FIG. 3 support structure 13 angles away from frame 30 near the top 70 and bottom 80 portions. In this manner support structure 13 can provide added stability to top portion 70 to assist in supporting the weight of LED display 20 without interfering with LED display 20 or causing the frame to lean forwards. Support structure 13 does not rest upon the ground or floor so that it does not serve to tip or tilt the frame in a forward direction.

Figure 3A:
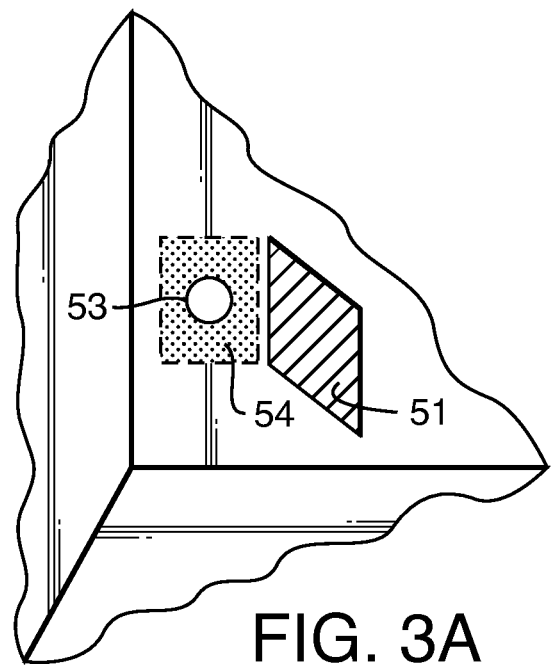
FIG. 3a shows a vent seal from within an air supported structure.
Figure 3B:
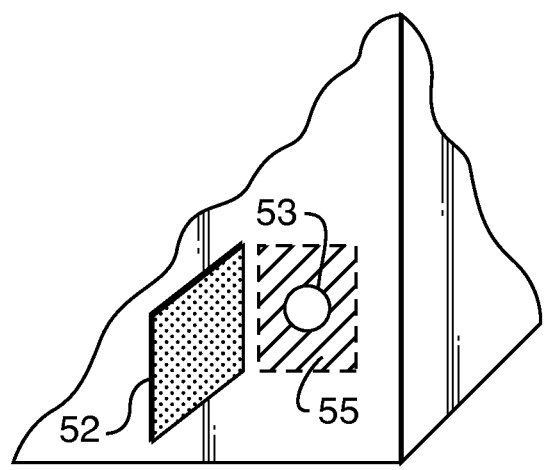
FIG. 3b shows a vent seal from the outside of an air supported structure.

In addition to placing the display in the middle of the framework and including an additional support structure, it may be necessary to use substantial air pressure within the air supported frame. Such pressures may be facilitated by outfitting the openings of the air supported frame with vents seals that are designed to withstand and maintain greater pressures. An example of such vent seals can be found in U.S. Pat. No. 8,192,245 to Deutsch et al, which is incorporated herein by reference. As shown in FIGS. 3a and 3b, these vent seals include an inner flap 51 and outer flap 52 that cover an opening 53 wherein the inner flap 51 and the outer flap 52 can be releasably attached to both an inner wall 54 and an outer wall 55 of the frame respectively as well as to each other. In operation, when an air supported device is to be inflated, inner flap 51 and outer flap 52 are closed over vent opening 53. As air pressure inside the air supported structure increases, the air pressure exerts an outward force upon inner flap 51, thereby pushing inner flap against outer flap 52, which serves to help maintain the attachment between the inner flap 51 and outer flap 52. In this manner, the vent seal resists leakage and allows for higher pressures to be maintained in the air supported structure thereby enabling heavier displays such as an LED display to be better supported by the frame.

A sheet-like material or other suitable covering may be attached to the back of the framework to reduce the amount of stray light striking the back of the LED display. This may be especially useful when operating the display outdoors during daylight hours. The material would preferably be of sufficient size to largely cover the area framed by the framework. In a preferred embodiment, when a covering is in place a ventilation system would operate to facilitate air flow between and through the covering and the LED screen so that the LED screen does not overheat while in use. Such a system could be realized, for example, by a blower or other suitable air flow device forcing air into an opening at the bottom of one side of the device and allowing air to escape through another opening at the top of the other side of the device.

The invention claimed is:

1. A portable device for mounting a large LED display comprising:
   an air supported frame with a front side and a rear side and including a top section, a bottom section, and side sections, wherein the air supported frame includes at least one opening for inflating and deflating the frame and the opening can be closed with a seal that includes
      a first component for covering the opening attached to an outer wall of the air supported frame near the opening and including fastener material on at least one side such that the first component is affixed to an area of the outer wall of the air supported frame around the opening when positioned to cover the opening; and
      a second component for covering the opening attached to an inner wall of the air supported frame near the opening and including fastener material on at least one side such that the second component is affixed to the first component and to the inner wall when the first component and the second component are positioned to cover the opening;
   an LED display attached to the air supported frame such that a display plane of the LED display is formed in the frame and is situated substantially midway between the front side and the rear side of the frame;
   a support structure attached at an upper attachment point to the top section on the rear side of the frame and at a lower attachment point to the bottom section on the rear of the frame wherein the support structure is substantially held up by the top section and the bottom section and between the upper attachment point and the lower attachment point the support structure generally avoids the display plane of the LED display; and
   a covering attached to the rear side of the frame such that the amount of stray light that strikes the LED display from behind is reduced, wherein an air flow device moves air into at least one inlet of the covering and out of at least one outlet of the covering in order to maintain sufficient air flow through a space formed by the covering, the frame and the LED display to prevent the LED display from overheating.

2. An air supported device for supporting an LED display comprising:
   an air supported framework including a top portion, a bottom portion, and side portions and having a front face and a rear face, wherein the framework includes at least one opening for inflating and deflating the framework and the opening includes
      a first component for covering the opening attached to an outer wall of the air supported framework near the opening and including fastener material on at least one side such that the first component is affixed to an area of the outer wall of the air supported framework around the opening when positioned to cover the opening; and
      a second component for covering the opening attached to an inner wall of the air supported framework near the opening and including fastener material on at least one side such that the second component is affixed to the first component and to the inner wall when the first component and the second component are positioned to cover the opening;
   an LED display with a display plane attached to the air supported framework such that the display plane is situated substantially midway between the front face and the rear face of the air supported framework;
   a support structure attached, at the rear face of the framework, at an upper attachment point to the top portion of the air supported framework and at a lower attachment point to the bottom portion of the air supported framework wherein the support structure is substantially held up by the top portion and the bottom portion of the framework and between the upper attachment point and the lower attachment point the support structure generally avoids the plane of the LED display; and
   a fabric attached to the rear face of the framework such that the amount of stray light striking the LED display from behind is reduced, wherein an air flow device forces air into at least one opening of the fabric and out of at least one outlet of the fabric in order to maintain sufficient air flow through an area between the fabric and the LED display to prevent the LED display from overheating.

* * * * *